(12) United States Patent
Dietl et al.

(10) Patent No.: US 9,111,970 B2
(45) Date of Patent: Aug. 18, 2015

(54) APPARATUS FOR THE HEAT TREATMENT OF DISC SHAPED SUBSTRATES

(76) Inventors: Waltraud Dietl, Illerkirchberg (DE); Patrick Schmid, Donzdorf (DE); Eddy Jager, Dornstadt (DE)

(*) Notice: Subject to any disclaimer, the term of this patent is extended or adjusted under 35 U.S.C. 154(b) by 1422 days.

(21) Appl. No.: 12/395,763

(22) Filed: Mar. 2, 2009

(65) Prior Publication Data

US 2009/0217875 A1 Sep. 3, 2009

Related U.S. Application Data

(60) Provisional application No. 61/051,213, filed on May 7, 2008.

(30) Foreign Application Priority Data

Mar. 3, 2008 (DE) .................. 10 2008 012 333

(51) Int. Cl.
*B05C 9/14* (2006.01)
*H01L 21/67* (2006.01)

(52) U.S. Cl.
CPC .... *H01L 21/67115* (2013.01); *H01L 21/67017* (2013.01)

(58) Field of Classification Search
USPC .............................. 118/725, 715; 156/345.52
See application file for complete search history.

(56) References Cited

U.S. PATENT DOCUMENTS 5,997,642 A * 12/1999 Solayappan et al. ............ 118/50
6,007,633 A 12/1999 Kitamura et al.
6,090,210 A * 7/2000 Ballance et al. .............. 118/725
6,143,081 A 11/2000 Shinriki et al.

(Continued)

FOREIGN PATENT DOCUMENTS

| DE | 397 06 248 T2 | 3/2002 |
| DE | 10 2005 024118 A1 | 11/2006 |
| EP | 0 252 667 A | 1/1988 |
| EP | 1 034 561 A | 6/1999 |
| EP | 1 155 437 A | 8/2000 |

(Continued)

OTHER PUBLICATIONS

International Search Report PCT/IB2009/050828, completed Mar. 2, 2009 and mailed Jun. 26, 2009.

*Primary Examiner* — Sylvia R MacArthur
(74) *Attorney, Agent, or Firm* — Dority & Manning, P.A.

(57) ABSTRACT

The application relates to an apparatus for the heat treatment of disc shaped substrates, in particular semi-conductor wafers. The apparatus has at least one radiation source and a treatment chamber accommodating the substrate having an upper wall element and a lower wall element, at least one of the wall elements lying adjacent to the at least one radiation source and being substantially transparent for the radiation from the radiation source. Furthermore, the apparatus makes provision for at least a first gas inlet apparatus. The first gas inlet apparatus has a plate element which is disposed within the treatment chamber between the substrate and the upper wall element, a collar ring disposed between the plate element and the upper wall element, and a first gas conveyance duct extending at least partially within the treatment chamber. The plate element has a larger diameter than the substrate and in a hole region approximately corresponding to the diameter of the substrate a plurality of through holes. The collar ring surrounds the hole region and has at least one inlet opening. The first gas conveyance duct has an outlet which is aligned with the inlet opening of the collar ring, a gas flow flowing out of the outlet having a main flow direction which is directed past a centre point of the collar ring.

43 Claims, 3 Drawing Sheets

(56) References Cited

U.S. PATENT DOCUMENTS

Figure 1:
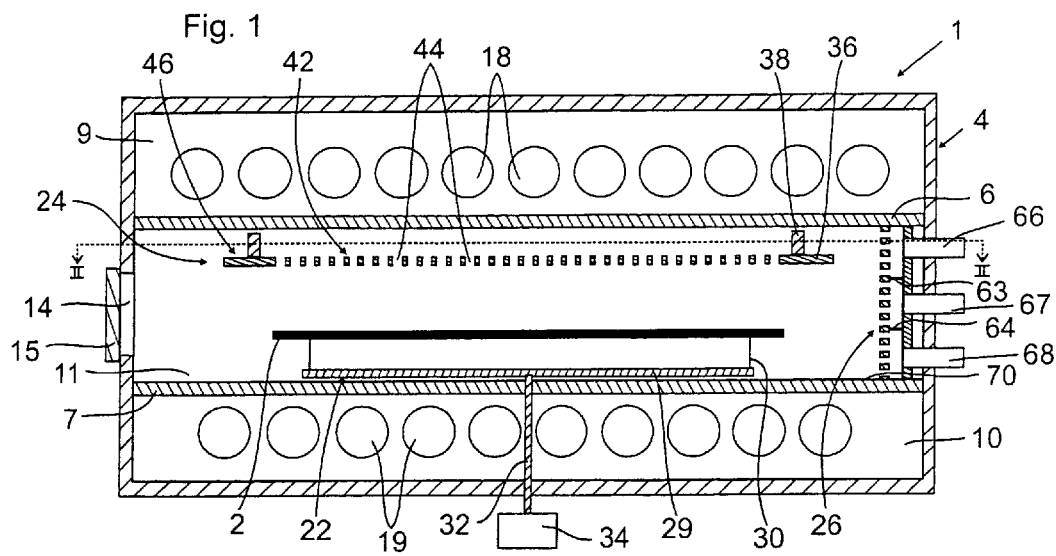

| | | | |
|---|---|---|---|
| 6,364,957 B1* | 4/2002 | Schneider et al. | 118/728 |
| 6,428,847 B1* | 8/2002 | Grant et al. | 427/248.1 |
| 6,494,958 B1* | 12/2002 | Shamouilian et al. | 118/728 |
| 2003/0013310 A1 | 1/2003 | Tomimori et al. | |
| 2003/0141178 A1* | 7/2003 | Shan et al. | 204/157.15 |
| 2008/0017114 A1 | 1/2008 | Watanabe et al. | |
| 2009/0217875 A1* | 9/2009 | Dietl et al. | 118/725 |

FOREIGN PATENT DOCUMENTS

| | | |
|---|---|---|
| EP | 1 063 690 A | 12/2000 |
| JP | 01 297820 A | 11/1989 |
| JP | 06 077136 A | 3/1994 |
| WO | WO 99/19536 A | 4/1999 |
| WO | WO 99/27563 | 6/1999 |
| WO | WO 00/46840 A | 8/2000 |
| WO | WO 2006/128018 A | 11/2006 |

\* cited by examiner

APPARATUS FOR THE HEAT TREATMENT OF DISC SHAPED SUBSTRATES

RELATED APPLICATIONS

The present application is based on and claims priority to U.S. Provisional Patent Application No. 61/051,213, filed on May 7, 2008 and claims priority to or the benefit of German Patent Application No. 10 2008 012333.1, filed on Mar. 3, 2008.

The present invention relates to an apparatus for the heat treatment of disc shaped substrates, in particular of semiconductor wafers. The application relates in particular to an apparatus having at least one radiation source and a treatment chamber accommodating the substrate having an upper wall element and a lower wall element, at least one of the wall elements which lies adjacent to the at least one radiation source being substantially transparent for the radiation from the radiation source.

These types of apparatus for the heat treatment of disc shaped substrates are widely used in semi-conductor technology. An apparatus of the above type is known, for example, from EP 1034561 A. The apparatus known from the latter also has in addition to the above specified features a gas inlet for conveying a process gas into the treatment chamber. This gas inlet is disposed on one side of the semi-conductor wafer and produces a gas flow extending substantially horizontally through the chamber. In this type of gas inlet apparatus however the problem of inhomogeneous treatment of the semiconductor wafer can arise because the gas is not distributed evenly over the semi-conductor wafer. In particular it is possible for the gas, when it reaches a peripheral region of the substrate, to react with the latter, and so the gas changes itself. As it then moves further over the wafer, the desired treatment result on the semi-conductor wafer caused by the gas also changes. This problem is particularly significant with wafer diameters which are becoming larger and larger.

An apparatus of the type described above is also known from EP 1155437 A. In this apparatus, a gas inlet lying above the substrate is provided having a plurality of inlet openings in order to apply a gas by means of a flow directed vertically into the treatment chamber onto a substrate located beneath the latter. The gas application apparatus is formed by a wall element forming the treatment chamber. Since the latter has a relatively large thermal mass, and heats up during the heat treatment of the substrate, a special cooling apparatus is provided which has cooling ducts in the wall element. This cooling apparatus is required in particular if reactive gasses are to be conveyed into the treatment chamber via the gas inlet since said reactive gases could react with heated elements of the gas application apparatus upon coming into contact with the latter.

Starting with the above-specified publications from the prior art, the object which forms the basis of the present invention is to specify an apparatus for the heat treatment of disc shaped substrates which overcomes one or more of the aforementioned problems of the prior art.

In order to achieve this object, the present invention provides for an apparatus according to claim 1. Further embodiments of the invention are given by the sub-claims.

In particular, an apparatus of the type specified at the start is provided, which further has at least a first gas inlet apparatus comprising a plate element disposed in the treatment chamber between the substrate and the upper wall element, a collar ring disposed between the plate element and the upper wall element, and a first gas conveyance duct extending at least partially within the treatment chamber. The plate element has a larger diameter than the substrate and, in a hole region corresponding approximately to the diameter of the substrate, a plurality of through holes. The collar ring surrounds the hole region and has at least one inlet opening. The first gas conveyance duct has an outlet which is aligned with the inlet opening of the collar ring, a gas flow flowing out of the outlet having a main flow direction which is directed past a centre point of the collar ring.

An apparatus having the above-specified features is capable of applying a homogeneous gas flow from above onto a substrate to be treated, and this is achieved, among other ways, by a gas flow being applied to the region between the collar ring, plate element and upper wall element such that the gas flow is directed past a centre point of the collar ring. In particular, homogeneity can be further improved if the apparatus has a rotation apparatus for accommodating and rotating a substrate within the treatment chamber and which supports the substrate on the side facing away from the upper wall element, and if the main direction of the gas flow is aligned with a rotation of the rotation apparatus. The apparatus enables rapid and homogeneous change of the gas atmosphere above the wafer without having to change the whole gas volume of the treatment chamber.

In one advantageous embodiment of the invention the main flow direction encloses an angle of between 5° and 25° with a radial line passing from the centre point of the collar ring and extending through a centre point of the outlet. In this way, a particularly homogeneous distribution of a gas flow directed through the plate element and onto the substrate surface is achieved. The main flow direction preferably encloses an angle of approximately 10° with a radial line passing from the centre point of the collar ring and extending through a centre point of the outlet.

In one particularly preferred embodiment of the invention the plate element in the plate plane is smaller than an inner periphery of the treatment chamber, by means of which the plate element can be accommodated totally within the treatment chamber. In this way the thermal mass of the plate element can be considerably reduced in relation to an element extending over the whole chamber, by means of which corresponding cooling of the plate element can be dispensed with. Cooling of the plate element can optionally be achieved at least partially by the gas flow itself.

Preferably, the plate element lies loosely on corresponding holding elements within the treatment chamber in order to enable removal of said plate element, for example for cleaning purposes. For homogeneous distribution of the gas flow through the through holes the plate element is preferably accommodated substantially parallel to the upper wall element within the treatment chamber.

For totally homogeneous covering of the substrate by the flow the hole region of the plate element is preferably larger than or equal to the diameter of the substrate. Furthermore, the through holes preferably extend substantially perpendicular to a plane of the plate element in order to achieve a flow, which is directed substantially vertical onto the substrate.

In one embodiment of the invention the through holes take up at least 20% of the area of the hole region of the plate element, this region being particularly suitable for steam applications, but also for gas or mixed applications. In an alternative embodiment which is suitable in particular for gas applications, but also for steam or mixed applications, the through holes take up at least 30%, preferably at least 40%, and in particular at least 50% of the area of the hole region of the plate element. Due to this the plate element has a small thermal mass in the hole region so that external cooling can be dispensed with, in particular if reactive gases or cooling gases are to be directed at the substrate. The through holes preferably have a diameter of between 4 mm and 20 mm, and in particular of at least 10 mm, by means of which large flows without high flow speeds can be achieved. In this way particle generation and the entrainment of particles in the region of the gas ducts can be avoided or at least reduced. Low flow speeds are particularly advantageous if a change in the gas atmosphere above the substrate is desired without having any negative effect upon thermophoretic effects in the region of the substrate surface. Due to low flow speeds, stresses to which the wafer and the rotation apparatus may be subjected by the gas flow are also kept low. Preferably, the through holes are distributed substantially evenly over the hole region of the plate element by means of which in turn homogeneous flow distribution over the substrate surface can be achieved. Preferably, no through hole is provided in the plate element above the centre of rotation of the rotation apparatus. This means that no excessively strong reaction or cooling takes place in the rotational centre because this region is otherwise constantly subjected to the gas, even with rotation of the substrate, whereas the other regions are not constantly subjected to said gas.

In one embodiment of the invention the plate element and/or the collar ring is substantially transparent for the radiation from the radiation source in order to enable direct heating of the substrate by the radiation source. In an alternative embodiment the plate element and/or the collar ring is substantially absorbent for the radiation from the radiation source in order to provide heating of the substrate via the plate element and/or the collar ring.

Advantageously, the collar ring is in contact with the plate element or the upper wall element and is spaced apart from the other element. This allows vibrations of the upper wall element, without such vibration being transferred to the plate element. This may prevent particle formation by elements hitting one another or by elements rubbing against one another. The distance between the collar ring and the other element is preferably between 0.1 and 1 mm, and preferably approximately 0.5 mm. The spacing should on the one hand enable vibrations, but on the other hand of course also guarantee a small flow loss due to the spacing.

In an alternative embodiment the collar ring is kept a distance apart both from the plate element and from the upper wall element within the treatment chamber. In this way vibrations both of the upper wall element and of the plate element can be made possible without being transferred to the other element or to the collar ring. The distance between the collar ring and the plate element and between the collar ring and the upper wall element is preferably between 0.1 and 1 mm, and preferably approximately 0.5 mm. Once again, vibrations should be allowed, while the flow loss through the gap is kept small.

Means for subjecting the upper wall element to a cooling fluid on the side facing away from the treatment chamber may be provided. Air, for example, can be used as a cooling fluid. The type of cooling fluid is unproblematic on the side facing away from the treatment chamber because it does not come into contact with the substrate in the treatment chamber. By means of the cooling excessive heating of the upper wall element can be avoided. In particular, in this way excessive heating of the upper wall element in the region of the plate element can be avoided. In this way, excessive heating of the gas conveyed into the space between the upper wall element and the plate element can be prevented.

In one embodiment of the invention the gas conveyance duct has a first flow cross-section at an inlet and the flow cross-section of the gas conveyance duct is at no point smaller than at the inlet. In this way congestion within the gas conveyance duct and turbulence of the gas being conveyed therethrough can be avoided. The gas conveyance duct preferably has a substantially constant flow cross-section in order to enable homogeneous flow. Preferably, the gas conveyance duct has an inlet lying outside of the treatment chamber so that it is freely accessible from the outside. The gas conveyance duct can have a substantially round flow cross-section in an inlet region and a substantially flat flow cross-section in an outlet region. The flat flow cross-section can for example be oval or square in form. The round cross-section on the inlet end enables simple conveyance through a side wall of the treatment chamber, whereas the flat flow cross-section serves to enable good positioning between the plate element and the upper wall element. For a simple embodiment the flow cross-section is substantially rectangular on the outlet end.

Preferably, at least one of the following elements is made of glass, in particular quartz glass: the upper wall element, the lower wall element, the plate element, the collar ring and at least part of the gas conveyance duct which extends within the treatment chamber. In this way the corresponding element is substantially transparent for the radiation from the radiation sources, and this leads to a small degree of heating of the respective element.

In order to guarantee discharge of the gas conveyed into the treatment chamber, at least one gas outlet extending into the treatment chamber is provided. The gas outlet preferably has a flow cross-section which is substantially equal to or larger than the flow cross-section of the gas conveyance duct. In this way congestion within the chamber can also be avoided without any active extraction because an equal amount of or more gas can be discharged via the gas outlet than via the gas inlet. In one embodiment at least two gas outlets are provided at opposite ends of the treatment chamber by means of which more homogeneous gas discharge from the chamber can be provided. This can further improve the homogeneous flow distribution over the substrate. The apparatus can have a controllable gas exhaustion device connected to the gas outlet in order to provide active gas exhaustion.

In a further embodiment of the invention the first gas inlet apparatus has a second gas conveyance duct extending at least partially within the treatment chamber having an outlet which is aligned with an inlet opening of the collar ring. By providing two gas conveyance ducts which are connected to inlet openings of the collar ring, even more homogeneous application of gas to the substrate can be achieved. Moreover, it is possible to convey different gases via the gas conveyance ducts which only mix in the region of the collar ring, and so only directly before they are conveyed over the substrate. This can be advantageous in particular with gases reacting with one another.

It is possible for the outlet openings of the first and second gas inlet apparatus to be aligned with a common inlet opening of the collar ring by means of which, directly in this region, mixing of the gases introduced via the two gas inlet apparatuses is made possible.

In order to provide a flow in the plane of the substrate in addition to a flow directed onto the substrate from above, preferably at least a second gas inlet apparatus is provided with at least one gas outlet directed within the treatment chamber such that a gas flow flowing out of the latter is directed substantially parallel to the upper wall element. By providing this further gas inlet apparatus it is possible to provide both a flow directed perpendicularly over the substrate (vertical) and also a flow parallel to the substrate plane (horizontal) within the chamber. The horizontal flow through the second gas inlet apparatus can offer advantages in particular for rapid flushing processes.

In accordance with one embodiment, at least two gas outlets which are directed into the treatment chamber are provided, such that a respective gas flow flowing out of the latter is directed substantially parallel to the upper wall element, wherein the gas outlets provide gas flows in different, substantially parallel planes. In this way it is possible to provide gas flows in different planes through the treatment chamber. This enables the specific exchange of gases in particular regions of the treatment chamber. It is possible for the gas outlets to be subjected to different gases by means of which different gas regions can be formed within the treatment chamber.

According to one embodiment of the invention at least one further gas inlet apparatus is provided which has at least a first plate element extending substantially perpendicularly to the upper wall element with a first side facing towards the first rotation apparatus, a second side facing away from the rotation apparatus, and a plurality of passages extending between the sides, and a gas feed provided to convey a gas into a region lying adjacent to the second side of the plate element. In this way a particular embodiment is specified in order to achieve a substantially horizontal flow through the treatment chamber. The inlet apparatus can have at least a second plate element which is disposed, spaced apart, adjacent and substantially parallel to the second side of the plate element in order to form a gas conveyance space between the two. Preferably the passages in the first plate element are disposed such that they direct a gas flow flowing therethrough substantially parallel to the upper wall element.

Preferably at least two different controllable groups of passages are provided in order to be able to subject different regions of the treatment chamber with gas differently. Preferably all of the passages of a group lie above a plane extending parallel to the upper wall element, whereas the passages of another group lie below the latter. In this way horizontal gas inlets are formed in different planes which can, if required, be controlled separately. For a simple embodiment of the second gas inlet apparatus the passages of a group are respectively connected to a common gas conveyance space, the respective gas conveyance spaces being substantially separated from one another. Furthermore it is possible to apply different gases to the respective gas conveyance spaces. Three or more groups of passages can be provided.

In one embodiment of the invention the first plate element extends substantially parallel to a side wall of the treatment chamber. Alternatively, however, it is also possible for the side wall of the treatment chamber itself to substantially form the plate element or for gas outlets to be formed integrally in the side wall. The first plate element preferably extends substantially over the whole breadth and height of the side wall of the treatment chamber in order to be able to produce a substantially homogeneous and preferably laminar flow over the breadth and height of the treatment chamber. Preferably a closeable loading and unloading opening is provided in a side wall of the treatment chamber lying opposite the first plate element.

Figure 2:
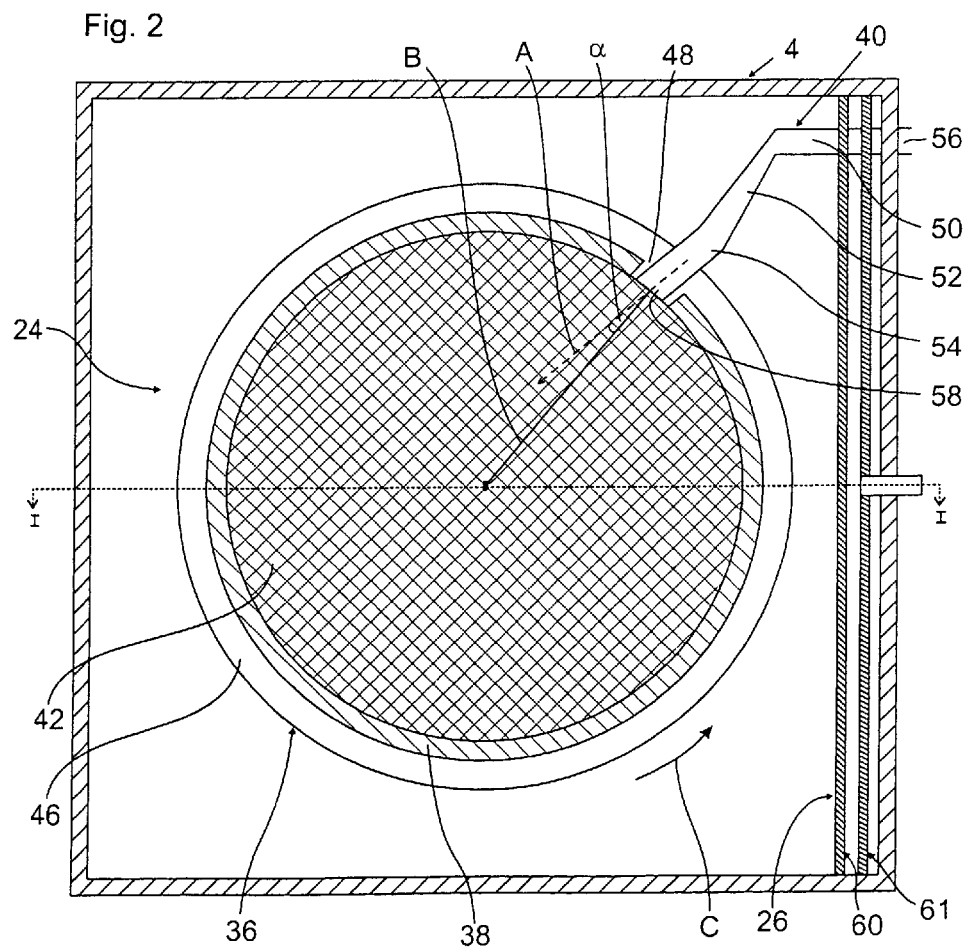
Figure 3:
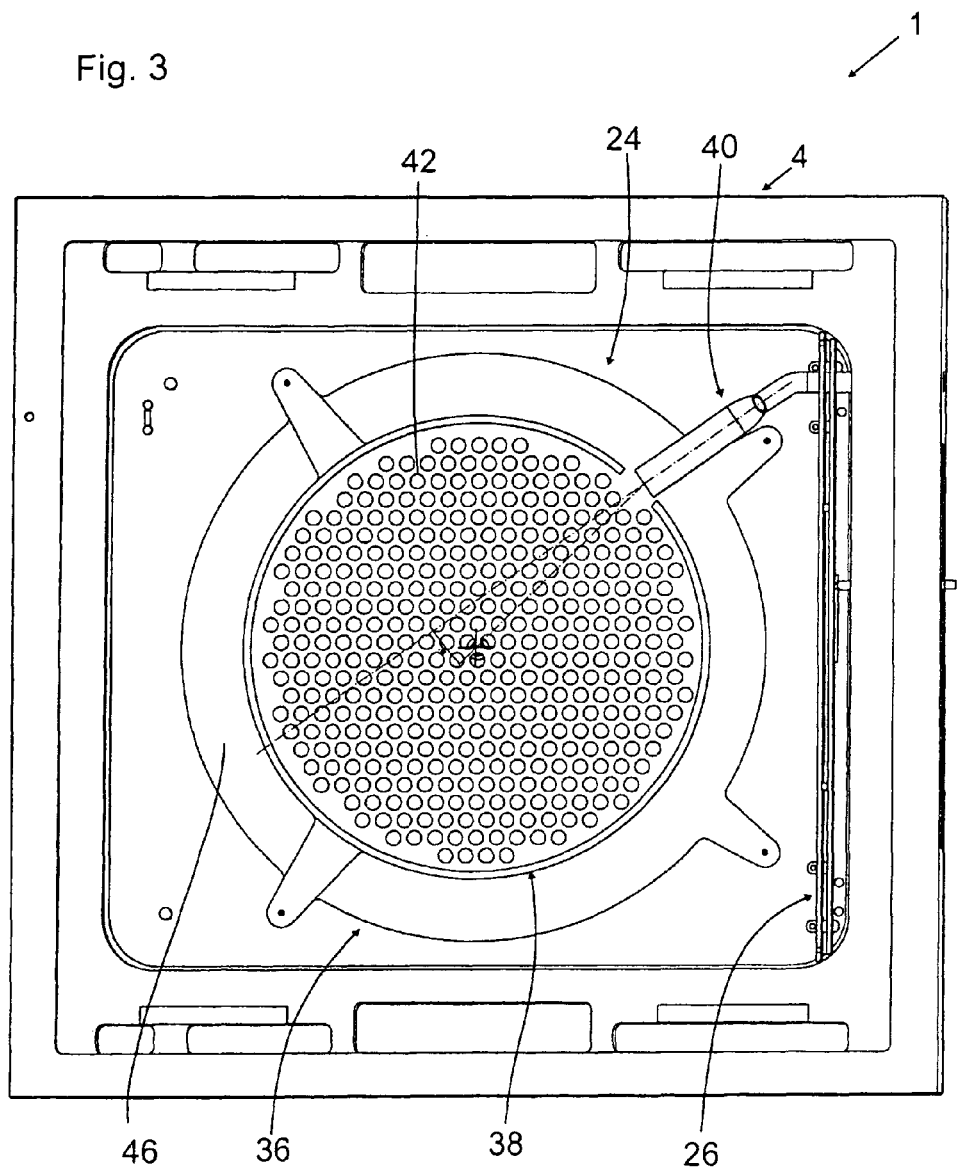
Figure 4:
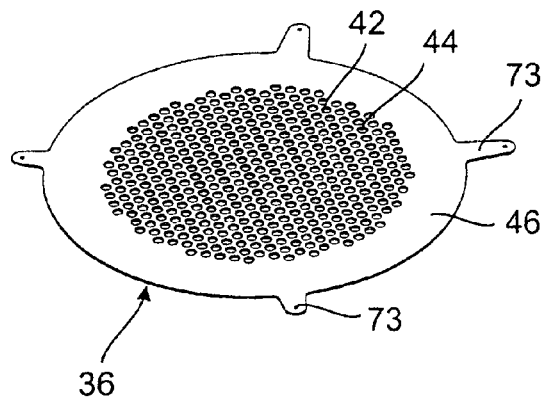
Figure 5:
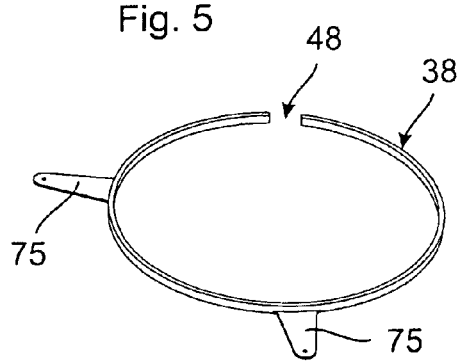

The invention is described in greater detail below by means of the figures; the figures show as follows:

FIG. 1 a diagrammatic sectional view of an exemplary apparatus for treating substrates;

FIG. 2 a diagrammatic sectional view of the apparatus according to FIG. 1 along line II-II;

FIG. 3 a diagrammatic top view of a treatment apparatus according to an alternative embodiment of the invention, FIG. 4 a perspective view of a plate element according to FIG. 3;

FIG. 5 a perspective view of a collar ring according to FIG. 3;

FIGS. 6a and 6b different views of a gas conveyance duct which is used with the apparatus in FIG. 3.

Locational and/or directional details given in the following description relate to the illustration in the drawings and a preferred arrangement of the elements shown in relation to one another. These details are in no way to be considered as restrictive. The wording "substantially parallel" used in the application covers a deviation in relation to exact parallelism of up to approximately 10°. The wording "substantially transparent" used in the application is intended to include transparency of at least approximately 80%. The wording "substantially absorbent" used in the application is intended to include absorption of approximately 80%.

FIGS. 1 and 2 show different views of a first embodiment of a rapid heating system 1 for the heat treatment of semi-conductor wafers 2. The rapid heating system 1 has a diagrammatically illustrated housing 4 which is divided by upper and lower quartz walls 6, 7 into an upper lamp chamber 9, a lower lamp chamber 10 and a treatment chamber 11. The housing 4 has a loading and unloading opening 14 in the region of the treatment chamber 11 which can be closed by a door element 15. The opening 14 makes it possible to load and unload the semi-conductor wafer 2 as well as additional elements, if so required.

In the upper lamp chamber 9 a plurality of heating lamps 18 are disposed parallel to one another which can be controlled in a known way in order to heat the semi-conductor wafer 2. Correspondingly, in the lower lamp chamber 10 a plurality of heating lamps 19 disposed parallel to one another are provided which in turn can be controlled in a known way in order to heat up the semi-conductor wafer 2.

In the embodiment illustrated, the heating lamps 18, 19 provided in the upper and lower lamp chambers 9, 10 are longitudinal lamps which extend perpendicularly to the plane of the page in FIG. 1. The longitudinal lamps can, for example, be of the tungsten halogen or arc lamp type. Other types of lamps or a mixed arrangement of different types of lamps within the lamp chambers are also possible. An arrangement of the lamps different to that illustrated can also be provided. In the region of the lamp chamber 9 and 10 the housing 4 has inwardly facing reflective surfaces in order to reflect radiation emitted from the lamps 18, 19 to the treatment chamber 11.

The upper and lower quartz walls 6, 7 are substantially transparent for the radiation from the heating lamps 18, 19. An apparatus, not shown in detail, is provided for cooling at least the upper quartz wall 6. This apparatus can, for example, have a cooling fluid inlet into the lamp chamber 9. As a cooling fluid air, for example, can be used, and this is directed from the side of the lamp chamber 9 onto the upper quartz wall 6, and is then conveyed away from the lamp chamber 9 in an appropriate manner. Of course other cooling means for the upper quartz wall 6 can also be provided. A corresponding cooling apparatus can be provided for the lower quartz wall 7.

Within the treatment chamber 11 a holding apparatus 22 is provided for accommodating and holding the semi-conductor wafer 2, a first gas inlet apparatus 24, and a second gas inlet apparatus 26.

In the embodiment shown to FIG. 1 the holding apparatus 22 has a plate element 29 which supports a plurality of retaining pins 30 which on their free end accommodate the semi-conductor wafer 2. The plate element is supported on its end facing away from the semi-conductor wafer 2 by a rotating shaft 32 which in turn is connected to a rotation drive 34. Therefore the part of the holding apparatus 22 lying within the treatment chamber 11 is held rotatably by means of a rotation drive 34 lying outside of the treatment chamber 11. Of course other holding apparatuses instead of the holding apparatus 22 shown can also be provided within the treatment chamber 11. In particular, a holding apparatus is also known with which the holding apparatus and/or the semi-conductor wafer itself is supported without any contact and is set in rotation, for example by a gas cushion. The only important thing is that the holding apparatus holds the semi-conductor wafer 2 rotatably within the treatment chamber 11.

The first gas inlet apparatus 24 essentially comprises a flat plate element 36, a collar ring 38 and a gas conveyance duct 40 which can be seen in FIG. 2. The plate element 36 is disposed by means of the holding elements, not shown in detail in FIGS. 1 and 2, parallel and adjacent to the upper quartz wall 6. The distance between the plate element 36 and the quartz wall 6 is for example approximately 9 mm, and the distance between the plate element 36 and the semi-conductor wafer 6 is for example approximately 12 mm. The distance between the plate element and the semi-conductor wafer should preferably be between the distance and twice the distance between the plate element 36 and the quartz wall 6.

The plate element 36 has a hole region 42 having a plurality of through holes 44 and a peripheral region 46 extending around the hole region. The hole region 42 is shown by cross-hatching in the top view of FIG. 2 and takes up a large part of the plate element 36. The hole region 42 is of a size corresponding to the semi-conductor wafer 2. In particular, the hole region 42 has the same diameter as or a larger diameter than the diameter of the semi-conductor wafer 2.

The plurality of through holes 44 extend perpendicularly through the plate element 36 and are distributed substantially evenly over the hole region 42. Preferably, no through hole 44 is provided in the centre of the hole region 42 which lies over the centre of rotation of the holding apparatus 22. The through holes 44 take up at least 40%, and preferably at least 50% of the hole region 42.

The peripheral region 46 of the plate element should be kept as small as possible. It serves, among other things, to support the collar ring 38, as will be explained in greater detail below, and as a holder for the plate element 36 within the treatment chamber 11.

As mentioned above, the collar ring 38 lies on the peripheral region 46 of the plate element 36 such that it totally surrounds the hole region 42 of the plate element 36. The distribution of the through holes 44 within the hole region 42 is chosen such that through holes 44 are accommodated totally within the collar ring 38, i.e. no through holes 44 which are partially covered by the collar ring 38 are provided. The collar ring 38 can simply lie on the plate element 36 or be attached to the latter in an appropriate manner.

If the collar ring 38 lies on the plate element 36 a small gap, which is preferably between 0.1 mm and 1 mm, is provided between the collar ring 38 and the upper quartz wall 6. In the currently preferred embodiment a gap of approximately 0.5 mm is provided between an upper side of the collar ring 38 and the upper quartz wall 6.

On its periphery the collar ring 38 has an inlet opening 48, as can be seen in the top view according to FIG. 2. Although it is shown in FIG. 1 that the collar ring 38 lies on the plate element 36 and is held a distance from the upper quartz wall 6, it is also possible to hold the collar ring 38 in contact both with the plate element 36 and with the upper quartz wall 6, or to hold the collar ring 38 on the upper quartz wall 6; but spaced apart from the plate element 36. It is also possible to hold the collar ring 38 spaced apart from both the upper quartz wall 6 and the plate element 36 within the treatment chamber 11.

The gas conveyance duct 40 has an inlet region 50 extending in a substantially straight line, a centre region 52 and an outlet region 54. The inlet region 50 extends outwardly through the housing 4 and has a connection end 56 which can be connected to a corresponding gas source. In particular it is possible to connect different gas sources to the connection end 56 so that different gases, such as for example a cooling gas and/or a process gas can be conveyed, one after the other, via the gas conveyance duct 40 into the treatment chamber 11. It is also possible to introduce different gases at the same time which then mix within the gas conveyance duct.

The inlet region 50 has a round cross-section by means of which simple conveyance through the housing 4 is made possible. The centre region 52 of the gas conveyance duct 40 makes provision for a change of the flow cross-section from a round cross-section to a flat cross-section. This change in the flow cross-section is implemented such that at no point is there a smaller flow cross-section in the centre region than in the inlet region 50 of the gas conveyance duct 40. In addition to a change in the flow cross-section the centre region 52 also makes provision for necessary positioning of the outlet region such that the outlet region is aligned in a special manner with the inlet opening 48 of the collar ring. The outlet region 54 of the gas conveyance duct 40 is substantially straight and has a flat flow cross-section, such as for example an oval or rectangular flow cross-section. The outlet region 54 of the gas conveyance duct 40 is disposed at least partially between the peripheral region 46 of the plate element 36 and the upper quartz wall 6, and preferably such that it is not in contact with the upper quartz wall 6. An outlet end 58 of the outlet region 54 extends into the inlet opening 48 of the collar ring 38 so that a gas flow flowing out of the outlet end 58 is directed into the collar ring 38. The outlet region 54 is disposed within its outlet end 58 such that a gas flow flowing out of the latter has a main flow direction A which is shown in FIG. 2 by a dashed line. The main flow direction A is not directed at the centre of the collar ring 38. The main flow direction A encloses an angle α of between 5 and 25° in relation to a radial line B passing from the centre point of the collar ring 38 and extending through a centre point of the outlet end 58. The flow resistance within the gas conveyance duct 40 should if possible at no time be smaller than at its inlet region 50.

The main flow direction A is aligned with a rotation direction C of the holding apparatus 22, i.e. the main flow direction A and the rotation direction C both run in an anticlockwise direction about the centre point of the collar ring 38. Of course it is also possible to direct the main flow direction A and the rotation direction C so that both run in a clockwise direction about the centre point of the collar ring 38.

The second gas inlet apparatus 26 has a first plate element 60, a second plate element 61, two separation elements 63, 64 extending between the plate element 60, 61, and gas conveyance ducts 66, 67 and 68.

The plate element 60 extends over the whole height and breadth of the treatment chamber 11, and parallel to a side wall of the latter. In particular, the first plate element 60 extends parallel to the side wall of the treatment chamber 11 lying opposite the opening 14. The first plate element 60 is in the form of a hole plate having a plurality of through holes 70. The plurality of through holes 70 is distributed evenly over the whole height and breadth of the first plate element 60.

The second plate element 61 also extends over the whole breadth and height of the treatment chamber 11, and in a space between the first plate element 60 and the adjacent side wall of the housing 4. In this way a gas conveyance space is formed between the plate elements 60, 61. This gas conveyance space is divided up by the separation elements 63, 64 into an upper gas conveyance plane, a central gas conveyance plane and a lower gas conveyance plane. The upper gas conveyance duct 66 is connected to the upper gas conveyance plane, whereas the gas conveyance duct 67 is connected to the central gas conveyance plane, and the gas conveyance duct 68 is connected to the lower gas conveyance plane. The gas conveyance ducts 66 to 68 extend respectively through the second plate element 61 and the adjacent side wall of the housing 4, and respectively have a connection end lying outside of the apparatus 1 which can be connected to an appropriate gas source. It is noted that the connection ends of the gas conveyance ducts 66 to 68 can be connected to several different gas sources, which allows the same and/or different gases to be individually applied to the gas conveyance ducts 66 to 68. In this way it is possible to provide by means of the second gas inlet apparatus a gas flow which is directed substantially horizontal through the treatment chamber 11 (substantially parallel to the surface of the semi-conductor wafer.) The skilled artisan will realize that the same and/or different gas flows can be provided in different planes.

Furthermore, in the treatment chamber 11 a gas outlet is provided (not shown in the figures) in order to discharge gases introduced by the first or second gas inlet apparatus 25, 26 from the treatment chamber 11. The gas outlet preferably has at least one flow cross-section which corresponds to the flow cross-section of the gas conveyance duct 40. The gas outlet can be passive in form, i.e. gases are not actively extracted from the treatment chamber 11, or active extraction can be provided, for example by a fan.

Next exemplary operation of the rapid heating system 1 is described in greater detail with reference to FIGS. 1 and 2.

Initially, a semi-conductor wafer 2 is introduced via the opening 14 into the treatment chamber 1 and is place on the holding apparatus 22. Next the door element 15 is shut in order to be able to start heat treatment of the semi-conductor wafer 2. The semi-conductor wafer 2 is rotated in its plane via the holding apparatus 22 and heated by corresponding control of the upper and lower heating lamps 18, 19.

By means of the first gas inlet apparatus 1, when a pre-specified temperature is reached a process gas is directed at the semi-conductor wafer 2 in order to treat the surface of the latter. A substantially vertical flow is applied to the surface of the semi-conductor wafer 2 in order to provide a homogeneous flow over the wafer surface. This homogeneous flow leads to homogeneous treatment of the semi-conductor wafer 2. Since the main flow direction A of the outlet region 54 of the gas conveyance duct 40 is offset in relation to a centre point of the collar ring 38, and is aligned with the direction of rotation C of the holding apparatus 22, particularly even flow onto the substrate surface is produced.

The process gas is introduced according to a pre-specified recipe into the treatment chamber 11. When introduction of the process gas has been completed, the heat treatment continues to run as desired. In order to discharge the process gas rapidly from the treatment chamber 1, a flushing gas, such as for example nitrogen, can then be conveyed through the treatment chamber 1, for example via the second gas inlet apparatus. The substantially horizontal gas flow direction which is provided by the second gas inlet apparatus enables rapid and good flushing of the whole treatment chamber.

At the end of the heat treatment cycle when the semi-conductor wafer 2 must be cooled down again, the heating lamps 18, 19 are switched off or their output is at least substantially reduced. In addition, a cooling gas can be directed onto the semi-conductor wafer 2, once again for example via the first gas inlet apparatus 24. Due to the flow directed substantially vertically onto the semi-conductor wafer 2, even cooling of the semi-conductor wafer 2 can be provided. In particular, process management is possible whereby the cooling gas is introduced into the treatment chamber with reduced flow speed even before the heating lamps are switched off so that at the point when the lamps are switched off, the full cooling output is immediately available.

Finally, the semi-conductor wafer 2 is removed from the treatment chamber 11 again through the opening 14.

The above process sequence is only given as a simple example, and the person skilled In the art will recognize that by providing the first gas inlet apparatus 24 and the second gas inlet apparatus 26 very different flow regimes within the treatment chamber 11 can be established. The first gas inlet apparatus 24 enables a particularly homogeneous flow onto the upper side of the semi-conductor wafer 2, which is particularly advantageous for process gases and cooling gases. The second gas inlet apparatus 26, however, enables substantially horizontal laminar flow through the treatment chamber 11. By means of the separation elements 63, 64 and the different controllability of the gas conveyance ducts 66 to 68 a substantially horizontally directed flow through the treatment chamber 11 is possible in differently controlled planes. Of course it is also possible to simultaneously introduce gases into the treatment chamber 11 via the first and second gas inlet apparatuses 24, 26.

Although the above embodiment only shows one gas conveyance duct 40 which introduces a gas into the region of the collar ring 38, at least one further gas conveyance duct corresponding to the gas conveyance duct 40 could be provided, which is for example connected to the same inlet opening 48 or to another inlet opening of the collar ring 38. In this way even more homogeneous gas distribution could be provided, in particular if the gas conveyance ducts were provided on opposite ends of the collar ring 38. Alternatively, however, it is also possible for example to introduce different gases into the region of the collar ring 38 via the gas conveyance ducts which mix in the latter so as then to be conveyed directly onto the surface of the semi-conductor wafer 2. This type of procedure could in particular be advantageous with very reactive gas mixtures which are only mixed with one another directly before being conveyed onto the semi-conductor wafer 2.

In the embodiment described above, different gas conveyance planes are formed by the separation elements 63, 64 between the plate elements 60, 61. It is, however, also possible to dispense with these separation elements if a horizontal flow through the treatment chamber 11 in different planes is not desired. In this case two of the gas conveyance ducts 66 to 68 could also be dispensed with. Of course only two or a larger number of gas conveyance planes can also be provided.

Figure 6:
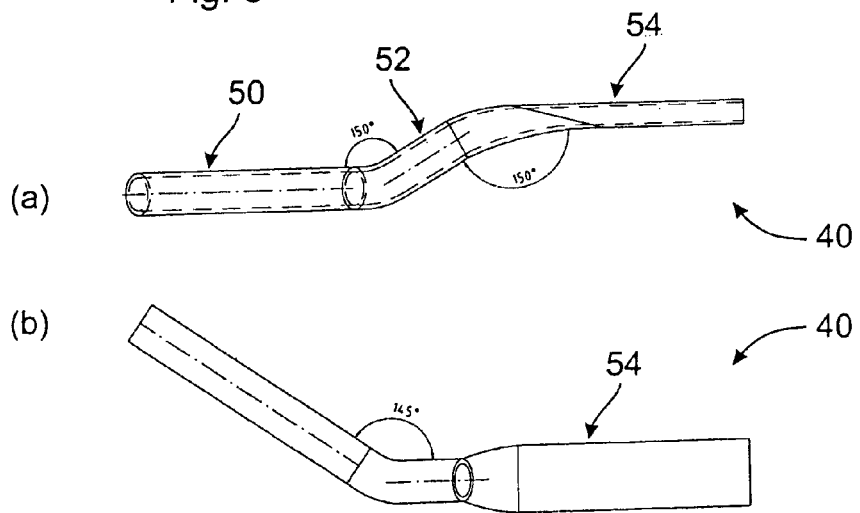

FIG. 3 shows a diagrammatic top view of a diagrammatic rapid heating system 1 for the heat treatment of semi-conductor wafers. FIGS. 4 to 6 respectively show different views of the elements used in the rapid heating system 1 according to FIG. 3. In the following description of FIGS. 3 to 6 the same reference numbers are used in so far as the same or similar elements are being described.

The rapid heating system 1 shown in FIG. 3 is of substantially the same design as the rapid heating system according to FIG. 1. In particular the rapid heating system 1 has a housing 4 which is divided into upper and lower lamp chambers and a treatment chamber lying between the latter by quartz walls (not shown). In the top view according to FIG. 3 an upper wall of the housing 4 and a heating lamp arrangement has been omitted in order to provide a view into the treatment chamber of the rapid heating system 1. Within the treatment chamber of the rapid heating system 1 a holding apparatus (not visible in FIG. 3) is once again provided for rotatably accommodating a semi-conductor wafer, a first gas inlet apparatus 24 and a second gas inlet apparatus 26. The first gas inlet apparatus 24 once again essentially comprises a flat plate element 36, a collar ring 38 and a gas conveyance duct 40.

FIG. 4 shows a perspective view of the plate element 36. As can be seen, the plate element 36 once again has a central hole region 42 having a plurality of through holes 44 and a peripheral region 46 surrounding the hole region 42. The through holes 44 are evenly distributed within the hole region 42, no through hole 44 being provided directly above the centre of rotation of the holding apparatus (not shown), as shown in the top view according to FIG. 3. As can be seen in the top view according to FIG. 3, the hole region 42 is only provided with through holes 44 which come fully within the collar ring 38. The hole region 42 is once again of a size corresponding to the size of the semi-conductor wafer 2, and preferably has an equal or larger diameter.

Projecting from the peripheral region 46 of the plate element four holding tabs 73 are provided which co-operate with positioning and holding pins in the treatment chamber in order to hold the plate element 36 within the treatment chamber. In particular holes are formed in the holding tabs 73 for accommodating the positioning and holding pins. By means of the holding tabs 73 and the retaining holes correct positioning of the plate element 36 also in alignment with the centre of rotation of the holding apparatus is possible. By means of the holding tabs 73 it is possible to hold the plate element outside of a handling region for the semi-conductor wafer.

FIG. 5 shows a perspective view of the collar ring 38 which has an inlet opening 48. The collar ring 38 has two holding tabs 75 on the outer periphery of the latter which respectively have a retaining opening for at least partially accommodating the positioning and holding pins. By means of the holding tabs 75 and the retaining opening correct positioning and holding of the collar ring 38 in relation to the plate element 36 is possible, as can easily be seen by the person skilled in the art. In particular the holding tabs 75 on the collar ring can be aligned with two of the holding tabs 73 on the plate element 36 by means of which the positioning and holding pins in the treatment chamber can pass both through the openings in the support tabs 73 and also through the positioning openings in the holding tabs 75 in order to position the elements relative to one another.

FIG. 6 shows two different views of the gas conveyance duct 40 which respectively has an inlet region 50, a centre region 52 and an outlet region 54. The gas conveyance duct 40 is of substantially the same design as in the first embodiment. As can be seen in FIG. 6a, the centre region 52 serves not only to change the flow cross-section from a round cross-section to a flat crosssection, but also to dispose the inlet region 50 and the outlet region 54 at different elevations. Moreover, the centre region 52 makes it possible for the inlet region 50 and the outlet region 54 to be angled in relation to one another.

The gas conveyance duct 40 is to be specially designed such that the flow cross-section remains substantially constant between an inlet end and an outlet end, and in particular is at no point smaller than at the inlet end.

As can be seen in the top view in FIG. 3, the outlet region 54 is directed into the collar ring 38 such that a main flow direction of a gas flowing outwards is not directed at the centre point of the collar ring. In fact, an angle of 10° is enclosed between a main direction of a gas flow flowing out of the outlet region 54 and a radial line extending from the centre point of the collar ring to the centre point of the outlet end. The main flow direction of the gas flowing out of the gas conveyance duct 40 is once again aligned to a rotation of the holding apparatus.

The second gas inlet apparatus 26 can substantially be of the same design as in the first embodiment.

In accordance with the embodiment of to FIG. 3, a gas outlet (not shown) for the treatment chamber is once again provided.

The apparatus according to FIG. 3 can be operated in the same way as with the previous embodiment. In particular, different horizontally and vertically directed gas flows can once again be achieved in the treatment chamber by means of the first and second gas inlet apparatus 24, 26, respectively.

In one embodiment the gas conveyance duct 40 is formed in the centre region and in the outlet region from a material which is substantially transparent for the radiation from the heating lamps 18, 19. On the other hand, in the inlet region 50 the gas conveyance duct 40 is not made of a material which is substantially transparent for the radiation of the heating lamps in order to prevent the heat radiation generated by the heating lamps 18, 19 from exiting the treatment chamber 11. The outside of the inlet region could for example be made of a reflective material, while a material absorbing the radiation from the heating lamps may be provided on the inside in order to prevent the heat radiation of exiting the treatment chamber by multiple reflections.

The apparatus described above is suitable for wafers of a wide variety of sizes, the size of the respective elements being adapted to the size of the wafer. Even with large wafer diameters of e.g. 450 mm or larger homogeneous flow over the wafer surface can be achieved. The apparatus is not limited to round semi-conductor wafers either, but can in general also be adapted to discoidal substrates with any peripheral form, such as e.g. square substrates, the hole area of the plate element 36 preferably totally covering the substrate.

With non-round forms the form of the hole area can be adapted, in particular if the substrate is held stationarily within the treatment chamber. With rotation of the substrate, however, the round form of the hole region is preferably maintained in order to guarantee total covering of the substrate by the hole region at all times.

Although the apparatus has been described by means of specific embodiments of the invention, the invention is not restricted to the specifically illustrated embodiments. In particular different rotation mechanisms for a substrate disposed within the treatment chamber can be provided, or the rotation mechanism can be totally dispensed with. It is also possible, for example, to omit the upper heating lamps 18 or the lower heating lamps 19 so that heating of the semi-conductor wafer is implemented exclusively by the remaining heating lamps 19, 18.

It is also possible to make the plate element 36 from a material substantially absorbing the heat radiation instead of from a material which is substantially transparent for the heat radiation from the lamps. The plate element is then heated strongly by controlling the heating lamps and would itself emit heat radiation in the direction of the semi-conductor wafer. The semi-conductor wafer is then heated by heat radiation from the plate element, and by the heat radiation from the heating lamps passing through the passages. The second gas inlet apparatus can also be different in design, integrated for example into a side wall of the treatment chamber, or it could be totally dispensed with.

The invention claimed is:

1. An apparatus for the heat treatment of disc shaped substrates which comprises the following:
   at least one radiation source;
   a treatment chamber accommodating the substrate having an upper wall element and a lower wall element at least one of the wall elements which lies adjacent to the at least one radiation source being substantially transparent to radiation from the radiation source; and
   at least a first gas inlet apparatus which comprises the following:
   a plate element which is disposed within the treatment chamber between the lower wall element and the upper wall element and being substantially parallel to a plane of the upper wall element, the plate element configured to have a larger diameter than a substrate placed in the treatment chamber, the plate element defining a hole region that is configured to have a diameter that substantially corresponds to a diameter of a substrate placed in the treatment chamber, the hole region including a plurality of through holes that extend perpendicularly through the plate element and face the lower wall element;
   a collar ring defining a centre point disposed between the plate element and the upper wall element, the collar ring surrounding the hole region, and having at least one inlet opening; and
   a first gas conveyance duct extending at least partially within the treatment chamber having an outlet which is aligned with the inlet opening of the collar ring, a gas flow flowing out of the outlet having a main flow direction which is directed past the centre point of the collar ring and at an angle with a radial line passing from the centre point of the collar ring and extending through a centre point of the outlet such that the main flow direction past the centre point of the collar ring is in a clockwise or counterclockwise direction.

2. The apparatus according to claim 1, characterized by a rotation apparatus for accommodating and rotating the substrate within the treatment chamber such that the rotation apparatus supports the substrate on the side facing away from the upper wall element, the main flow direction being directed past the centre point of the collar ring in alignment with a rotation of the rotation apparatus.

3. The apparatus according to claim 2, characterized in that no through hole is provided in the plate element above the centre of rotation of the rotation apparatus.

4. The apparatus according to claim 2, characterized in that the first gas inlet apparatus has a second gas conveyance duct extending at least partially within the treatment chamber, and having an outlet which is aligned with the inlet opening of the collar ring, a gas flow flowing out of the outlet having a main flow direction which is directed past a centre point of the collar ring in alignment with a rotation of the rotation apparatus.

5. The apparatus according to claim 4, characterized in that the outlets of the first and second gas conveyance ducts are both aligned with the inlet opening of the collar ring.

6. The apparatus according to claim 2, characterized by at least a second gas inlet apparatus which has at least a first plate element extending substantially perpendicularly to the upper wall element having a first side facing towards the rotation apparatus, a second side facing away from the rotation apparatus, and a plurality of passages extending between the sides, and at least one gas feed for conveying a gas into a region lying adjacent to the second side of the plate element.

7. The apparatus according to claim 6, characterized in that the second gas inlet apparatus has at least a second plate element which is disposed, spaced apart, adjacent and substantially parallel to the second side of the first plate element in order to form at least one gas conveyance space therebetween.

8. The apparatus according to claim 6, characterized in that the passages in the first plate element direct a gas flow flowing therethrough substantially parallel to the upper wall element.

9. The apparatus according to claim 6, characterized in that at least two differently controlled groups of passages are provided.

10. The apparatus according to claim 9, characterized in that all of the passages of a group lie above a plane extending parallel to the upper wall element, whereas the passages of another group lie below the latter.

11. The apparatus according to claim 9, characterized in that the passages of a group are respectively connected to a common gas conveyance space, the respective gas conveyance spaces being substantially separated from one another and being subjected to gas differently.

12. The apparatus according to claim 6, characterized in that at least three groups of passages are provided.

13. The apparatus according to claim 6, characterized in that the first plate element extends substantially parallel to a side wall of the treatment chamber.

14. The apparatus according to claim 13, characterized in that the first plate element extends substantially over the whole breadth and height of the side wall of the treatment chamber.

15. The apparatus according to claim 13, characterized in that a closeable loading and unloading opening is provided in a side wall of the treatment chamber lying opposite the first plate element.

16. The apparatus according to claim 1, characterized in that at least the upper wall element lies adjacent to a radiation source and is substantially transparent for the radiation from the radiation source.

17. The apparatus according to claim 1, characterized in that the main flow direction encloses an angle of between 5° and 25°, with a radial line passing from the centre point of the collar ring and extending through a centre point of the outlet.

18. The apparatus according to claim 1, characterized in that the plate element in a plate plane is smaller than an inner periphery of the treatment chamber.

19. The apparatus according to claim 1, characterized in that the plate element lies loosely on corresponding holding elements within the treatment chamber.

20. The apparatus according to claim 1, characterized in that the hole region of the plate element is configured to be larger than or equal to a diameter of a substrate placed in the treatment chamber.

21. The apparatus according to claim 1, characterized in that the through holes take up at least 20% of the area of the hole region of the plate element.

22. The apparatus according to claim 1, characterized in that the through holes have a hole diameter of between 4 mm and 20 mm.

23. The apparatus according to claim 1 characterized in that the through holes are distributed substantially evenly over the hole region of the plate element.

24. The apparatus according to claim 1, characterized in that the plate element and/or the collar ring is at least substantially transparent to radiation from the at least one radiation source.

25. The apparatus according to claim 1, characterized in that the plate element and/or the collar ring is substantially absorbent to radiation from the radiation source.

26. The apparatus according to claim 1, characterized in that the collar ring is in contact with the plate element or the upper wall element and is spaced apart from the other element.

27. The apparatus according to claim 1, characterized in that the distance between the collar ring and the upper wall element is between 0.1 mm and 1 mm.

28. The apparatus according to claim 1, characterized in that the collar ring is kept a distance apart from the plate element and the upper wall element within the treatment chamber.

29. The apparatus according to claim 1, characterized in that the distance between the collar ring and the plate element and between the collar ring and the upper wall element is between 0.1 mm and 1 mm.

30. The apparatus according to claim 1, characterized by means for subjecting the upper wall element to a cooling fluid on the side facing away from the treatment chamber.

31. The apparatus according to claim 1, characterized in that the gas conveyance duct has a first flow cross-section at an inlet, wherein a flow cross-section of the gas conveyance duct is at no point smaller that the first flow cross-section at the inlet.

32. The apparatus according to claim 1, characterized in that the gas conveyance duct has a flow cross-section which remains substantially constant.

33. The apparatus according to claim 1, characterized in that the gas conveyance duct has an inlet lying outside of the treatment chamber.

34. The apparatus according to claim 1, characterized in that the gas conveyance duct has a substantially round flow cross-section in an inlet region, and a substantially flat flow cross-section in an outlet region.

35. The apparatus according to claim 34, characterized in that the flow cross-section is substantially rectangular in the outlet region.

36. The apparatus according to claim 1, characterized in that at least one of the following is made of glass: the upper wall element, the lower wall element, the plate element, the collar ring and at least part of the gas conveyance duct.

37. The apparatus according to claim 1, characterized by at least one gas outlet extending into the treatment chamber.

38. The apparatus according to claim 37, characterized in that the at least one gas outlet defines a flow cross-section which is substantially equal to or larger than a flow cross-section of the gas conveyance duct.

39. The apparatus according to claim 37, characterized in that at least two gas outlets are provided at opposite ends of the treatment chamber.

40. The apparatus according to claim 37, characterized by at least one controllable gas exhaustion device is connected to the gas outlet.

41. The apparatus according to claim 1, characterized by at least a second gas inlet apparatus having at least one gas outlet directed into the treatment chamber such that a gas flow flowing out of the latter has a main flow direction which is directed substantially parallel to the upper wall element.

42. The apparatus according to claim 41, characterized in that the second gas inlet apparatus has at least two gas outlets directed into the treatment chamber such that a respective gas flow flowing outwards has a main flow direction which is directed substantially parallel to the upper wall element, the gas outlets providing gas flows in different, substantially parallel planes.

43. The apparatus according to claim 41, characterized in that different gasses or the same gas at different pressures may be applied to different the gas outlets.

* * * * *